US008728928B2

United States Patent
Auvray et al.

(10) Patent No.: US 8,728,928 B2
(45) Date of Patent: May 20, 2014

(54) METHOD FOR PRODUCING AN ELECTRODE MADE WITH MOLYBDENUM OXIDE

(75) Inventors: Stephane Auvray, Suresnes (FR); Nikolas Janke, Herzogenrath (DE)

(73) Assignee: Saint-Gobain Glass France, Courbevoie (FR)

( * ) Notice: Subject to any disclaimer, the term of this patent is extended or adjusted under 35 U.S.C. 154(b) by 735 days.

(21) Appl. No.: 12/682,270

(22) PCT Filed: Oct. 8, 2008

(86) PCT No.: PCT/FR2008/051817
§ 371 (c)(1),
(2), (4) Date: Jul. 19, 2010

(87) PCT Pub. No.: WO2009/053608
PCT Pub. Date: Apr. 30, 2009

(65) Prior Publication Data
US 2010/0282300 A1    Nov. 11, 2010

(30) Foreign Application Priority Data
Oct. 12, 2007   (FR) ..................... 07 58271

(51) Int. Cl.
*H01L 21/44*    (2006.01)
(52) U.S. Cl.
USPC .................... 438/608; 136/252; 257/763
(58) Field of Classification Search
USPC .............. 257/43, 103; 438/239, 608; 136/252
See application file for complete search history.

(56) References Cited

U.S. PATENT DOCUMENTS

| 6,372,538 | B1 | 4/2002 | Wendt et al. |
| 2003/0012881 | A1* | 1/2003 | Schintlmeister et al. ...... 427/378 |
| 2005/0236032 | A1* | 10/2005 | Aoki ............................. 136/252 |
| 2007/0013301 | A1* | 1/2007 | Yamazaki et al. ............ 313/506 |
| 2007/0151862 | A1 | 7/2007 | Dobson et al. |
| 2007/0193623 | A1 | 8/2007 | Krasnov |
| 2009/0279004 | A1* | 11/2009 | Greenall et al. ................ 349/16 |

OTHER PUBLICATIONS

Assmann, L. et al., "Study of the Mo thin films and Mo/CIGS interface properties", Applied Surface Science, vol. 246, pp. 159-166, XP004872641, ISSN: 0169-4332, Jun. 15, 2005.
Bodegard, Marika et al., "The behaviour of Na implanted into Mo thin films during annealing", Solar Energy Materials & Solar Cells, vol. 58, pp. 199-208, XP004177955, ISSN: 0927-0248, Jun. 1, 1999.
Palm, J. et al., "CIS module pilot processing applying concurrent rapid selenization and sulfurization of large area thin film precursors", Thin Solid Films, vol. 431-432, pp. 514-522, XP004428698, ISSN: 0040-6090, May 5, 2003.

(Continued)

*Primary Examiner* — Kimberly Rizkallah
*Assistant Examiner* — Errol Fernandes
(74) *Attorney, Agent, or Firm* — Oblon, Spivak, McClelland, Maier & Neustadt, L.L.P.

(57) ABSTRACT

A method for producing a solar cell having a substrate, having an inner face, wherein said inner face is designed to receive a conductive element based on molybdenum, wherein the method comprises forming several layers based on molybdenum on the substrate, at least one of the layers being enriched in molybdenum oxide, wherein the layers are formed by a magnetron sputtering method, and wherein the layer enriched with molybdenum oxide is obtained by injecting oxygen, ozone or a mixture of gas containing oxygen in atomic form during the formation of the molybdenum-based conductive element.

5 Claims, 3 Drawing Sheets

(56) References Cited

OTHER PUBLICATIONS

Figure 1:
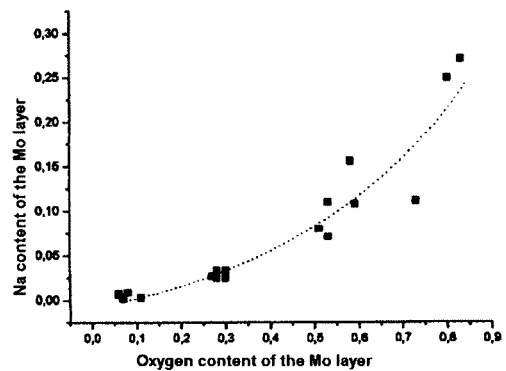

Bodeg, Ard Marika et al., "Growth of Cu(In,Ga)Se$_2$ thin films by coevaporation using alkaline precursors", Thin Solid Films, vol. 361-362, pp. 9-16, XP004187433, ISSN: 0040-6090, Feb. 1, 2000.

Schmid, Dieter et al., "A comprehensive characterization of the interfaces in Mo /Cis /CdS /ZnO solar cell structures", Solar Energy Materials and Solar Cells, vol. 41, No. 42, pp. 281-294, XP004007947, ISSN: 0927-0248, Jun. 6, 1996.

* cited by examiner

METHOD FOR PRODUCING AN ELECTRODE MADE WITH MOLYBDENUM OXIDE

The present application is the U.S. counterpart of WO 2009/053608, the text of which is incorporated by reference, and claims the priority of French application No. 0758271, filed on Oct. 12, 2007, the text of which is incorporated by reference.

The present invention relates to a substrate provided with a conductive element, notably designed to constitute an electrode entering into the constitution of a solar cell, as well as a method for producing same.

It is known that, in the construction of some solar cells, a non-conductive substrate is employed, usually consisting of a standard soda-lime-silica glass, on the inner face (called the air face) of which is deposited a conductive electrode, called the rear electrode, that is designed to come into perfect adherence with an absorbing agent.

The latter may preferably consist of ternary chalcopyrite compounds that generally contain copper, indium and selenium. These are then what is called $CISe_2$ absorbing agent layers. Gallium may also be added to the absorbing agent layer (e.g.: $Cu(In,Ga)Se_2$ or $CuGaSe_2$), aluminum (e.g.: $Cu(In,Al)Se_2$), or sulfur (e.g.: $CuIn(Se,S)$). They are referred to generally hereinafter by the term chalcopyrite absorbing agent.

It will be understood that the rear electrode should possess, among other properties, the lowest possible electrical resistance. This is why molybdenum is generally chosen, in spite of its high price, to make up the rear electrode of solar cells, by reason of the many advantages that it offers, particularly as regards its low resistivity as well as its resistance to selenium and sulfur.

It is also known that the high performances required for these types of cell can only be attained by rigorous control of the crystalline growth of the chalcopyrite absorbing agent layer. Now it is known that the growth of grains thereof is very clearly improved by the presence of sodium (Na) in a controlled quantity in the region of the molybdenum/absorbing agent interface, making it possible to reduce the density of defects of the absorber and to increase its conductivity.

The necessary Na may be of external origin and be derived from an addition, notably of NaF, $Na_2O_2$, $Na_2Se$, or may be of internal origin, namely coming from the glass substrate itself, which then provides the function of an Na reservoir. According to this last technique, a layer of molybdenum that is permeable to Na is deposited on the glass substrate, preferably a soda-lime-silica glass and, during the thermal annealing to which this is subjected conventionally during the process of producing the cell, Na diffuses freely from the substrate from the Mo/absorbing agent interface where it is then able to ensure the previously mentioned function.

One of the difficulties encountered when this technique is implemented is that, in practice, it is only possible to control, in a partial and imprecise manner, the quantity of Na that diffuses through the molybdenum layer during the annealing operation.

Some of the causes of this difficulty are well known, that are on the one hand the non-uniform distribution of Na at the surface of the glass substrate and, on the other hand, the non-homogeneity of the properties of the molybdenum layer deposited thereon.

Now, it has been found and demonstrated that the Na content of the molybdenum layer of a solar cell is very closely correlated to the molybdenum oxide content of this layer.

It may therefore be concluded that the Na content, and thus the crystalline quality of the chalcopyrite absorbing agent layer is strongly linked to the control of the oxygen content of the molybdenum layers.

The object of the present invention is to provide a substrate and its production method making it possible to control the content of Na that is capable of diffusing into the upper active layers of a solar cell during the production thereof.

The object of the present invention is therefore a substrate notably designed to enter into the constitution of a solar cell, of which one face, called the inner face, is designed to receive a molybdenum-based conductive element, characterized in that the conductive element is formed of several molybdenum-based layers, at least one of these layers being enriched with molybdenum oxide.

In preferred embodiments of the invention, it is possible, as the case may be, to make use moreover of one and/or or other of the following arrangements:

said enriched layer is formed on the face of the conductive element in contact with the substrate, the enriched layer then containing between 1 and 75% atomic oxygen, preferably between 20 and 70% atomic oxygen, said enriched layer is formed on the free face of the conductive element, the enriched layer then containing between 1 and 75% atomic oxygen, preferably between 5 and 40% atomic oxygen, several enriched layers are disposed following the thickness of the conductive element, the enriched layers are distributed in a superimposed manner in the thickness of the conductive element following a concentration gradient in molybdenum oxide, the layer with the maximum concentration of molybdenum oxide may be in contact either with the substrate or be situated at the level of the free face of the conductive element, the concentration gradient of atomic oxygen extends from 1 to 75%, the molybdenum oxide consists of MoO and/or $MoO_2$ and/or $MoO_3$, over- or sub-stoichiometric according to the oxygen content, the conductive element constitutes an electrode of a photoelectric cell.

The subject of the present invention is also a solar cell characterized in that it includes a substrate as previously described.

The object of the present invention is also a method for producing a substrate, notably designed to enter into the constitution of a solar cell, of which one face, called the inner face, is designed to receive a conductive element based on molybdenum, characterized in that it comprises steps consisting of forming several layers based on molybdenum on the substrate, at least one of these layers being enriched in molybdenum oxide.

In preferred embodiments of the invention, use may moreover be made of one and/or or other of the following arrangements:

said layers are formed by a magnetron sputtering method, the layer enriched in molybdenum oxide is obtained by injecting an oxygenated compound such as oxygen, ozone $O_3$ or mixture of gases containing oxygen in the atomic form such as carbon dioxide $CO_2$ or water vapor $H_2O$, during the step of producing the molybdenum-based conductive element, the oxygenated compound injected comes from a mixture of oxygen, or ozone $O_3$ or a gas mixture containing oxygen in the atomic form, such as carbon dioxide $CO_2$ or water vapor $H_2O$, and argon, the argon used is that employed for providing magnetron sputtering, the layer enriched in molybdenum oxide is formed on said inner face of the conductive element while performing thermal annealing of the molybdenum layer in the presence of said oxygenated compound.

Figure 2:
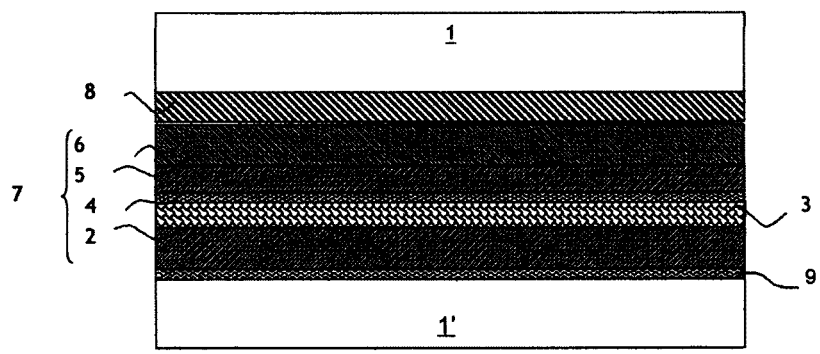
Figure 3:
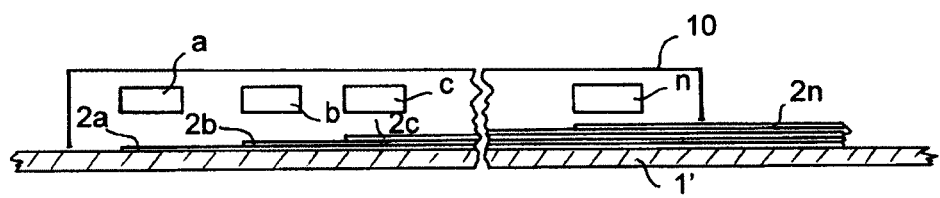
Figure 4:
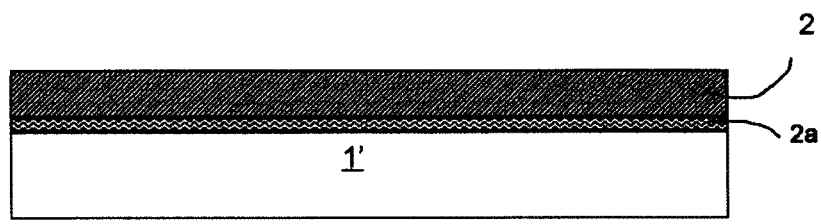
Figure 5:
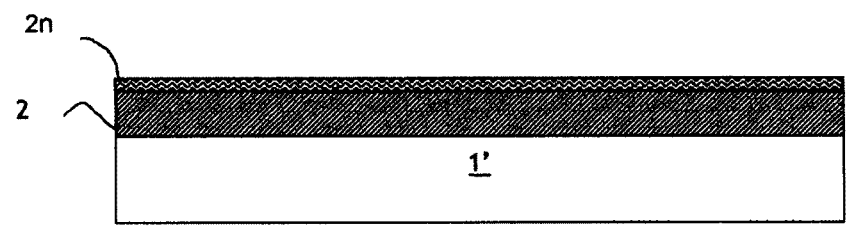
Figure 6:
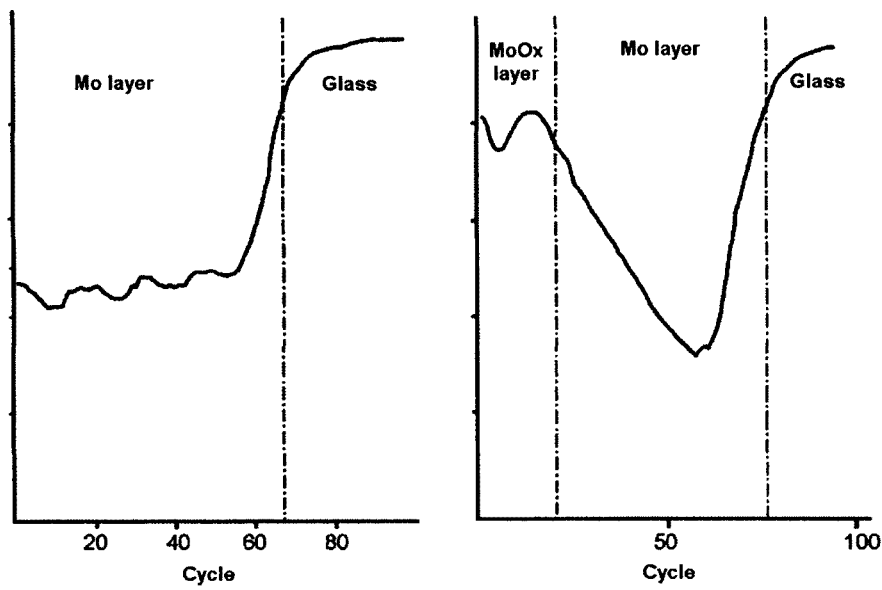
Figure 7:
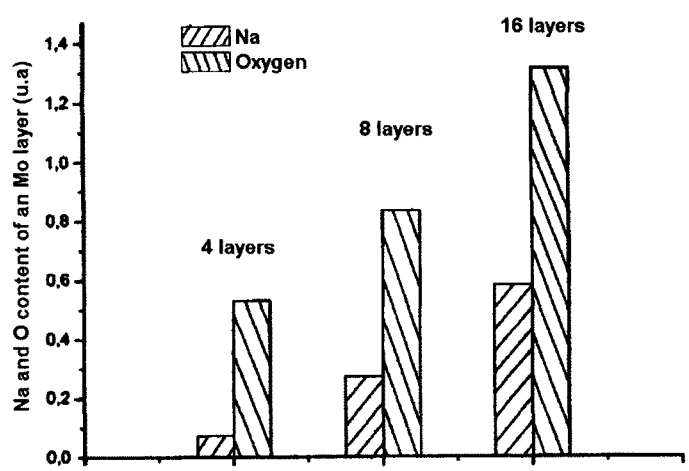

A form of implementation of the present invention will be described hereinafter by way of a non-limiting example, with reference to the appended drawings in which:

FIG. 1 is a graph establishing the relationship existing between the respective concentration of the sodium and oxygen of a molybdenum-based layer of a rear electrode of a solar cell, and this for various instants in the production of the electrode, FIG. 2 is a schematic representation of a solar cell produced in accordance with the method according to the invention, FIG. 3 is a schematic representation of a magnetron sputtering device, FIG. 4 is a schematic representation of a substrate covered with a molybdenum layer between which a sub-layer of molybdenum oxide is deposited, FIG. 5 is a schematic representation of a substrate covered with a molybdenum layer, itself coated with a molybdenum oxide layer, FIG. 6 is a graph representing the SIMS profile (secondary ionization mass spectroscopy) for sodium, respectively of a glass substrate covered with a molybdenum layer and the same glass substrate covered again with a molybdenum layer and a molybdenum oxide layer, FIG. 7 is a graph representing the respective concentrations of Na and O of a conductive element of molybdenum formed respectively of four, eight and sixteen layers.

According to the present invention, a solar cell is produced from a transparent substrate 1' which, first of all, is covered with a conductive element 2 designed to constitute, in the present embodiment, an electrode called the rear electrode of the cell.

The substrate 1' preferably consists of a soda-lime-silica glass of which most of the weight (that is to say at least 98% by weight) or even all thereof consists of a material or materials having the best possible transparency and preferably having an absorption per unit length less than 0.01 $mm^{-1}$ in the part of the spectrum that is useful for the application (solar cell), generally the spectrum extending from 380 to 1200 nm.

According to a preferred embodiment of the present invention, the molybdenum-based electrode 2 is deposited on the glass substrate 1' by a magnetron sputtering method, well known in this type of technique, and which is represented in a schematic form in FIG. 3. This method thus employs several molybdenum targets a, b, c, d . . . n below which the glass substrate 1' to be covered passes, producing in this way a molybdenum thickness formed of n layers $2a$, $2b$, $2c$, . . . $2n$ respectively, corresponding to each of the targets used.

The technique of forming the electrode on the substrate 1' by magnetron sputtering makes it possible to give perfectly controlled specific characteristics to each of the layers forming the thickness of the electrode 2.

Now it has been established by the inventors that the sodium concentration existing in the molybdenum layer following migration of Na is very closely correlated to the molybdenum oxide concentration thereof. This correlation appears in FIG. 1 which represents the value of the Na concentration of this layer as a function of the value of its oxygen concentration and this for various points corresponding to molybdenum layers deposited on the substrate at various production times. On this curve, each point corresponds to measurements called SIMS of the sodium and oxygen concentrations carried out on the same sample.

In a first embodiment of the invention, it is desired to produce a substrate such as that shown in FIG. 4 in which the molybdenum layer $2a$ enriched in molybdenum oxide is deposited in contact with the glass 1', this layer then being covered with several other layers so as to constitute the molybdenum-based electrode 2.

To this end, there is injected on the first target a of the machine 10, and conjointly with the argon used in a known manner for implementing the magnetron sputtering method, a flow of an oxygenated compound such as oxygen, ozone $O_3$ or a gas mixture containing oxygen in atomic form, such as carbon dioxide $CO_2$ or water vapor $H_2O$ or a mixture of argon/oxygenated compound with a small oxygen content preferably of the order of 100 ppm. In this example of an embodiment of the invention this injection is carried out by inserting a secondary feed of said oxygenated compound on the existing argon feed line of the installation, making it possible to control precisely the pressure, flow rate and concentration of the oxygen-based compound/argon injected.

In this way, a first molybdenum layer $2a$, or sub-layer, is obtained that is enriched in molybdenum oxide and that is covered with a series of superimposed layers of molybdenum forming the electrode 2, as shown in FIG. 4.

In this embodiment, the conductivity of the sub-layer, of which, it will be understood, the conductivity falls consequently when it is further doped with oxygen, does not constitute a critical parameter in as much as the conductivity will be given by the electrode 2. Consequently, the oxygen content of the molybdenum oxide could be high, of the order of 1 to 75%, preferably 20 to 75%, of atomic oxygen which will provide good Na "pumping".

In order to constitute the cell, there is then deposited in a known manner, on this electrode 2, a functional layer 3 based on a chalcopyrite absorbing layer, itself coated with a thin layer 4 of cadmium sulfide (CdS) enabling a pn junction to be created with the chalcopyrite layer. In point of fact, the chalcopyrite agent is generally n doped, the CdS layer being p doped, which enables the pn junction to be created that is necessary for the establishment of an electric current. Finally, the CdS layer is covered with a tie layer 5 formed of zinc oxide called intrinsic (ZnO:i).

In order to form the second electrode of the cell, the ZnO:i layer is covered with a layer 6 of transparent conductive oxide called TCO (for "Transparent Conductive Oxide"). This conductive layer 6 should be as transparent as possible and have a high light transmission in all wavelengths corresponding to the absorption spectrum of the material constituting the functional layer, so as not to reduce unnecessarily the yield of the solar cell.

The stack 7 of these various thin layers is terminated by a transparent substrate 1, at the top of the drawing, with the interposition of a laminating insert 8, for example of polyurethane (PU), polyvinyl-butyral (PVB) or ethylene-vinyl acetate (EVA), the assembly being, in a known manner, encapsulated peripherally with the aid of a seal or an impervious resin. In this way, the solar cell shown in FIG. 2 is obtained.

In the present embodiment of the invention, during the annealing step necessary for crystallization of the chalcopyrite absorbing agent, Na present in the glass substrate is in this way "pumped" to saturation by the molybdenum oxide sub-layer $2a$, as far as saturation thereof, with the effect of homogenizing the distribution of Na at its interface with the molybdenum-based electrode 2. In this way, according to the invention, an Na reservoir is created that guarantees a constant input of the latter and a concentration ensuring good crystallization of the chalcopyrite absorbing agent during the annealing step.

The present invention also makes it possible to produce a substrate coated with its electrode that is of constant quality and possesses an Na content that is guaranteed and of which the parameters can be ensured, and that is totally controlled, in this way making it possible to avoid the usual step of enriching the molybdenum layer with Na.

In another embodiment of the invention shown in FIG. 5, the molybdenum oxide layer has been deposited on the molybdenum-based layer 2 once this is formed on the substrate 1'. To this end, contrary to the preceding method, oxygenation of the last target n of the machine 10 is achieved so that the layer enriched in molybdenum oxide is the layer 2n deposited on the layers forming the electrode 2.

Such an embodiment presents two essential advantages. First of all, the "Na reservoir" is situated close to the layer of chalcopyrite absorbing agent which guarantees injection of Na that is at the same time rapid and in sufficient quantity to ensure good crystallization of this absorber. Next, this solution solves the problems of contamination of the outer layers of the substrate during storage thereof. Indeed, it is known that the method for producing molybdenum-based electrodes is a continuous method which means that the substrates coated in this way are stored in a pile on trestles before they are subsequently used in a repetitious method during which the layer based on absorbing material will be deposited on the surface of the molybdenum electrode. Now, during the phases of storing the substrates on trestles, the molybdenum-based layer faces a glass substrate. This sodium-rich face is liable to contaminate the molybdenum face and to enrich it over time. This uncontrolled doping mechanism may lead to a drift in production methods during the repeated molybdenum disposition phase. In as much as, according to the invention, the outer layer is saturated with Na, there is consequently no longer a risk of creating irregularities in the distribution of Na on the surface thereof.

In this embodiment, the conductivity of the molybdenum oxide enriched layer will be necessary, so that it will be of value to at least dope it with oxygen. It will then be possible to have its atomic oxygen content situated between approximately 1 to 75%, preferably 4 to 40% atomic oxygen.

The present invention also enables molybdenum oxide enriched layers to be distributed with a concentration gradient extending following the thickness of the electrode 2, and this by making changes to a controlled oxygenation of the target a, b, c, . . . n of the magnetron sputtering machine 10. In this way it will be possible to have an oxygen concentration gradient extending from 1 to 75 atomic percent and conversely.

It will also be possible, according to the invention, to adjust the molybdenum oxide content and therefore the Na content of the electrode 2 by increasing the number n of targets used in the magnetron sputtering machine 10, and thus the number of layers deposited that are capable of being doped with oxygen. It is therefore possible to produce an electrode 2 formed of a series of alternating layers, Mo/Mo—O/Mo/Mo—O etc. It will thus be seen in the diagram of FIG. 7 that by increasing the number of layers of an electrode, for the same thickness of the latter, the oxygen content thereof is increased at the same time, and consequently that of Na.

According to the invention, the molybdenum oxide layer may be formed on the substrate 1' and/or on the free surface of the molybdenum-based conductive element, namely the electrode 2, by any method other than magnetron sputtering. It may notably be formed on the molybdenum electrode 2 by forming surface oxidation thereof by performing its thermal annealing in the presence of the oxygenated compound.

In FIG. 6, the SIMS profile is shown for sodium, respectively of a glass substrate coated with a molybdenum layer and a glass substrate according to the invention on which a molybdenum-based layer has been deposited, of which the surface has been covered with a molybdenum oxide layer by the thermal annealing method. The appearance on the latter curve of a wide Na peak will be noted, establishing the presence of Na at the level of the molybdenum oxide layer.

Of course, according to the invention, it would be possible to deposit said molybdenum oxide sub-layer at the same time on the inner face of the substrate, namely on the face thereof designed to receive the molybdenum layer (glass interface/Mo) and on the free face of the latter, namely the face thereof opposite the substrate (air interface/Mo). This variant enables the advantages of the two techniques to be cumulated.

According to another variant of the invention, the invention is also applicable in the case of a substrate that would have been recovered, prior to deposition of the molybdenum-based layer, with a layer designed to constitute a barrier to alkalis, and which could notably consist of silicon nitrides, oxides or oxynitrides, or aluminum nitrides, oxides or oxynitrides, or titanium nitrides, oxides or oxynitrides, or zirconium nitrides, oxides or oxynitrides, used alone or mixed.

The invention claimed is:

1. A method for producing a solar cell comprising a substrate, having an inner face, wherein said inner face is designed to receive a conductive element based on molybdenum, wherein said method comprises forming several layers based on molybdenum on the substrate, at least one of said layers being enriched in molybdenum oxide,
    wherein said layers are formed by a magnetron sputtering method, and
    wherein the layer enriched with molybdenum oxide is obtained by injecting oxygen, ozone, or a mixture of gas containing oxygen in atomic form during the formation of the molybdenum-based conductive element.

2. The method as claimed in claim 1, wherein the oxygen injected comes from a mixture of oxygen and argon.

3. The method as claimed in claim 2, wherein the argon used is that employed for providing magnetron sputtering.

4. The method as claimed in claim 2, wherein the layer enriched with molybdenum oxide is obtained by injecting a mixture of gas containing oxygen in atomic form, said mixture of gas is carbon dioxide or water vapor.

5. The method as claimed in claim 1, wherein the layer enriched in molybdenum oxide is formed on said inner face of the conductive element while performing thermal annealing of the molybdenum layer in the presence of said oxygenated compound.

* * * * *